United States Patent
Lee (10) Patent No.: US 8,306,100 B2
(45) Date of Patent: Nov. 6, 2012

(54) TEST CIRCUIT CAPABLE OF MASKING DATA AT READ OPERATION AND METHOD FOR CONTROLLING THE SAME

(75) Inventor: Kwang-Su Lee, Ichon (KR)

(73) Assignee: SK hynix Inc. (KR)

( * ) Notice: Subject to any disclaimer, the term of this patent is extended or adjusted under 35 U.S.C. 154(b) by 1141 days.

(21) Appl. No.: 12/177,838

(22) Filed: Jul. 22, 2008

(65) Prior Publication Data

US 2009/0122850 A1 May 14, 2009

(30) Foreign Application Priority Data

Nov. 9, 2007 (KR) .................. 10-2007-0114124

(51) Int. Cl.
*H04B 17/00* (2006.01)

(52) U.S. Cl. ......... 375/226; 375/224; 375/231; 375/233

(58) Field of Classification Search .............. 375/226; 370/241; 379/90.01; 455/67.11, 115.1, 115.2, 455/115.3, 115.4, 226.1, 226.2, 226.3, 226.4; 702/79

See application file for complete search history.

(56) References Cited

U.S. PATENT DOCUMENTS

| | | | |
|---|---|---|---|
| 6,272,068 B1 * | 8/2001 | La et al. .................. | 365/233.13 |
| 6,311,299 B1 | 10/2001 | Bunker | |
| 6,842,031 B2 * | 1/2005 | Koh et al. ................. | 324/756.02 |
| 7,478,287 B2 * | 1/2009 | Funaba et al. ................ | 714/700 |

FOREIGN PATENT DOCUMENTS

| | | |
|---|---|---|
| JP | 2001-006398 | 1/2001 |
| KR | 10-1999-0082815 | 11/1999 |
| KR | 1020000005597 | 1/2000 |
| KR | 1020030067891 | 8/2003 |

* cited by examiner

*Primary Examiner* — Dhaval Patel (74) *Attorney, Agent, or Firm* — Baker & McKenzie LLP (57) ABSTRACT

A test circuit capable of reducing the number of data I/O pins of a tester at a read operation includes a data masking control unit for masking a part of output data in response to an activation of one of an upper data masking signal to control a group of upper data pins and a lower data masking signal to control a group of lower data pins when a test mode signal is activated at a read operation.

22 Claims, 7 Drawing Sheets

TEST CIRCUIT CAPABLE OF MASKING DATA AT READ OPERATION AND METHOD FOR CONTROLLING THE SAME

CROSS-REFERENCES TO RELATED APPLICATION

This application claims the benefit under 35 U.S.C 119(a) of Korean application number 10-2007-0114124, filed on Nov. 9, 2007, which is incorporated herein in its entirety by reference as if set forth in full.

BACKGROUND

1. Technical Field

The embodiments described herein relate to a test circuit and a method for controlling the same and, more particularly, to a test circuit to control a data strobe signal and a method for controlling the same.

2. Related Art

Conventional semiconductor integrated circuits will often support various input/output (I/O) modes e.g., X4, X8 and X16 based on the number of I/O pins included in the circuit. These I/O modes determine the data bandwidth, i.e. the amount of data processed in a given time period.

During manufacturing, several semiconductor integrated circuits are simultaneously tested in parallel in order to reduce the testing time. During testing, the data I/O pins must be allocated according to the I/O mode of the semiconductor integrated circuit to be tested. For example, if one semiconductor integrated circuit is tested in an X16 I/O mode, then sixteen data I/O pins, which are correspondent to the X16 I/O mode, must be allocated. Therefore, the number of semiconductor integrated circuits to be tested in parallel is restricted based on the number of data I/O pins. Reducing the number of semiconductor integrated circuits to be tested in parallel inevitably increases the testing time. If the test is carried out with fewer I/O pins, e.g. by changing a X16 I/O mode to an X8 I/O mode, to improve the test efficiency, then more difficult to detect a failure of a specific pin.

SUMMARY

A test circuit capable of reducing the number of data I/O pins of a tester during a read operation is described herein. A method for controlling a test circuit configured to reduce the number of data I/O pins of a tester during a read operation is also described herein.

In one aspect, a test circuit can comprise a data masking control unit configured to mask a part of output data in response to an activation of one of an upper data masking signal to control a group of upper data pins and a lower data masking signal to control a group of lower data pins when a test mode signal is activated at a read operation.

In another aspect, during a read operation, a test circuit can comprise a data masking control unit configured to maintain, in a high impedance state, one of upper and lower data strobe signals. The upper and lower data signals can be generated in response to an upper data masking signal to control a group of upper data pins and a lower data masking signal to control a group of lower data pins. The upper data masking signal can be an inverted signal of the lower data masking signal.

In another aspect, a method for controlling a test circuit comprises applying an upper data masking signal to control a group of upper data pins and a lower data masking signal to control a group of lower data pins in response to a first read command while a test mode is activated, and then masking data corresponding to the group of upper or lower data pins in response to a voltage level of the upper or lower data masking signal to be activated, wherein the upper data masking signal can be an inverted signal of the lower data masking signal; and applying a signal, which can have an exclusive phase by inverting the upper or lower data masking signals, in response to a second read command while the test mode is activated, and then masking data corresponding to the group of upper or lower data pins in response to a voltage level of the upper or lower data masking signal to be activated.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

According to the embodiments described herein, output data can be read out twice to control the number of data output pins. That is, the data can be output twice by masking the upper and lower data during a read operation and during a write operation. The number of data I/O pins simultaneously accessed by an external tester at once can be half the number of data I/O pins used in an internal operation. By doing so, the total data I/O pins can be tested through two read operations. Accordingly, a cost-effective testing operation can be achieved by improving the efficiency in the restricted resource of the number of the data pins. Further, since the number of semiconductor integrated circuits to be tested in parallel can be increased, the testing time can be reduced and the yield of the semiconductor integrated circuits can also be increased.

Figure 1:
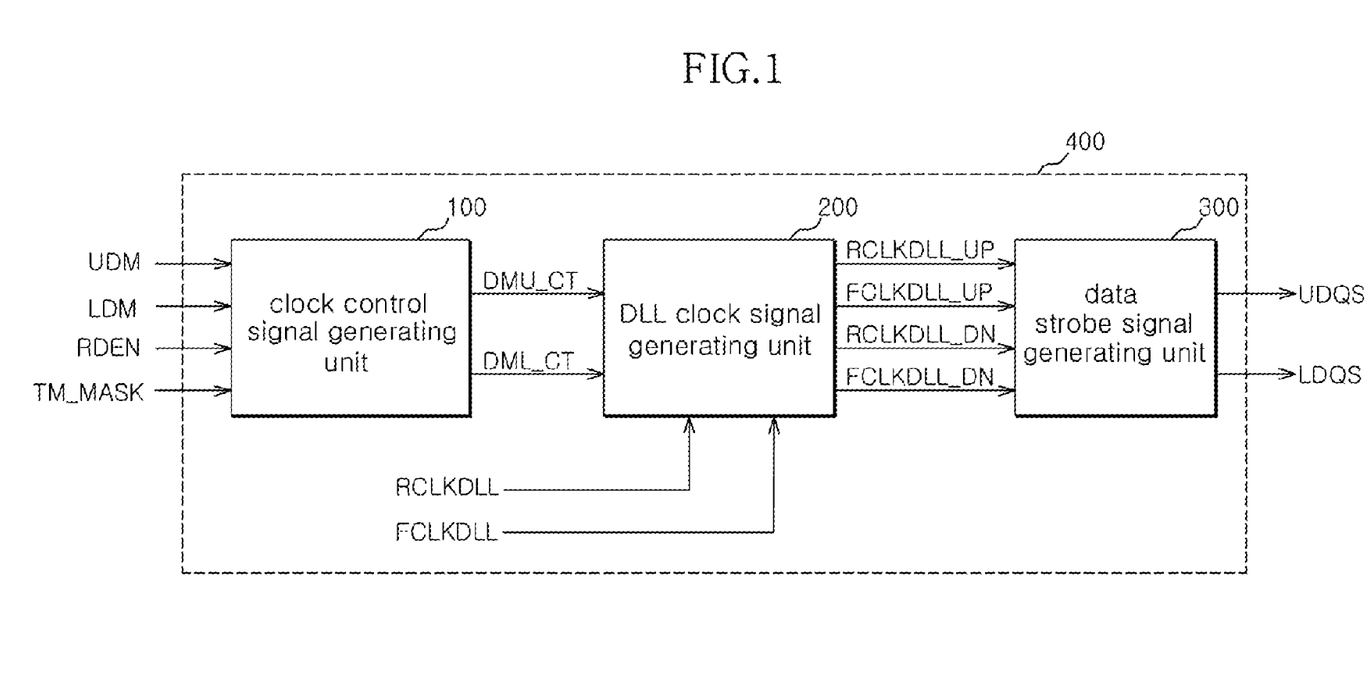
FIG. 1 is a block diagram illustrating a test circuit according to one embodiment described herein.

FIG. 1 is a block diagram illustrating a data masking control unit 400, according one embodiment. Referring to FIG. 1, the data masking control unit 400 can control the number of data to be sent in response to one of an upper data masking signal "UDM" and a lower data masking signal "LDM", which can be selectively activated when a test mode signal "TM_MASK" is activated. The data masking control unit 400 can include a clock-control signal generating unit 100, a DLL clock signal generating unit 200, and a data strobe signal generating unit 300.

First, the clock-control signal generating unit 100, which can receive the upper data masking signal "UDM", the lower data masking signal "LDM", a read command "RDEN" and a test mode signal "TM_MASK", can generate first and second clock control-signals "DMU_CT" and "DML_CT". Here, the upper data masking signal "UDM" can be a signal for masking a group of upper data pins and the lower data masking signal "LDM" can be a signal for masking a group of lower data pins. For example, in a case where the semiconductor integrated circuit is configured to process 16-bit data, the upper data masking signal "UDM" can be used as a control signal to control the masking of upper data "DQ<8:15>" and the lower data masking signal "LDM" can be used as a control signal to control the masking of lower data "DQ<0:7>".

The test mode signal "TM_MASK" can be a test signal that can be activated to perform the data masking at a read operation. Particularly, according to one embodiment, when the test mode signal "TM_MASK" is activated and a read operation is carried out, the voltage level of the upper data masking signal "UDM" and the lower data masking signal "LDM" are different from each other. The first and second clock-contol signals "DMU_CT" and "DML_CT", which are different from each other in a logic level, can be provided in response to an activation of one of the upper data masking signal "UDM" and the lower data masking signal "LDM".

The DLL clock signal generating unit 200, which can receive DLL (Delay Locked Loop) clock signals "RCLKDLL" and "FCLKDLL", and can produce upper data clock signals "RCLKDLL_UP" and "FCLKDLL_UP" and lower data clock signals "RCLKDLL_DN" and "FCLKDLL_DN" in response the first and second clock-control signals "DMU_CT" and "DML_CT". Accordingly, the upper data clock signals "RCLKDLL_UP" and "FCLKDLL_UP" and the lower data clock signals "RCLKDLL_DN" and "FCLKDLL_DN" can be produced in a fixed low level, when the DLL clock signal generating unit 200 receives an activation signal of the first and second clock signals "DMU_CT" and "DML_CT". However, as mentioned above, the first and second clock-contol signals "DMU_CT" and "DML_CT" can comprise different logic levels. Accordingly, for example, the DLL clock signal generating unit 200 can simultaneously receive an activation signal of the first clock-control signal "DMU_CT" and an deactivation signal of the second clock clock signal "DML_CT". When the DLL clock signal generating unit 200 can receive the activation signal of the first clock-control signal "DMU_CT", the DLL clock signal generating unit 200 can produce the upper data clock signals "RCLKDLL_UP" and "FCLKDLL_UP", which can be activated in a fixed low level. Meanwhile, when the DLL clock signal generating unit 200 receives the activation signal of the second clock-control signal "DML_CT", the DLL clock signal generating unit 200 can produce the lower data clock signals "RCLKDLL_DN" and "FCLKDLL_DN" as the clock signals. Here, the DLL clock signals "RCLKDLL" and "FCKDLL" can be conventional DDR (Double Data Rate) clock signals, which can be generated by a DLL circuit using an external clock signal and triggered by the rising and falling edges of the external clock signal.

The data strobe signal generating unit 300 can produce an upper data strobe signal "UDQS" and a lower data strobe signal "LDQS", which can be used as reference signals for the upper and lower data output, in response to the upper data clock signals "RCLKDLL_UP" and "FCLKDLL_UP" and the lower data clock signals "RCLKDLL_DN" and "FCLKDLL_DN", respectively. If the data strobe signal generating unit 300 receives only the upper data clock signals "RCLKDLL_UP" and "FCLKDLL_UP" in the fixed low level, then the data strobe signal generating unit 300 can produce the upper data strobe signal "UDQS" in a high impedance level. Since the upper data strobe signal "UDQS", which is used as the reference signal for outputting the upper data, is in a high impedance level, the data can be masked through the high impedance state.

In other words, it is not possible to discriminate the logice level of the data when the datastrobe signal "UDQS" is in the high impedance state. Thus, the number of data to be outputted is restricted when the data strobe signal of the corresponding data bits (upper or lower bits) is produced in the high impedance state.

In the test circuit 400, even if the semiconductor integrated circuit internally operates in an X16 I/O mode, it can be made to operate as though it is in an X8 I/O mode during the time of testing. As such, the pins of the tester and the semiconductor integrated circuit can be configured based on the X8 I/O mode.

Figure 2:
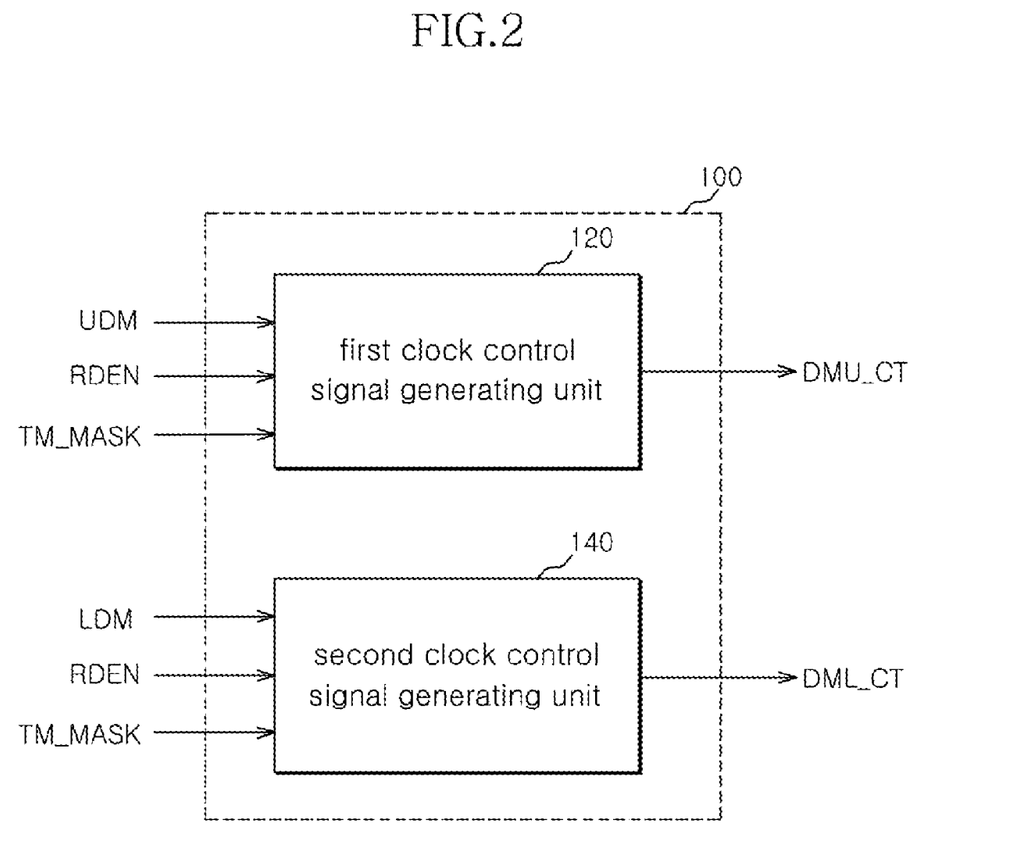
FIG. 2 is a block diagram illustrating a clock signal generating unit that can be included in the circuit illustrated in FIG. 1.
Figure 3:
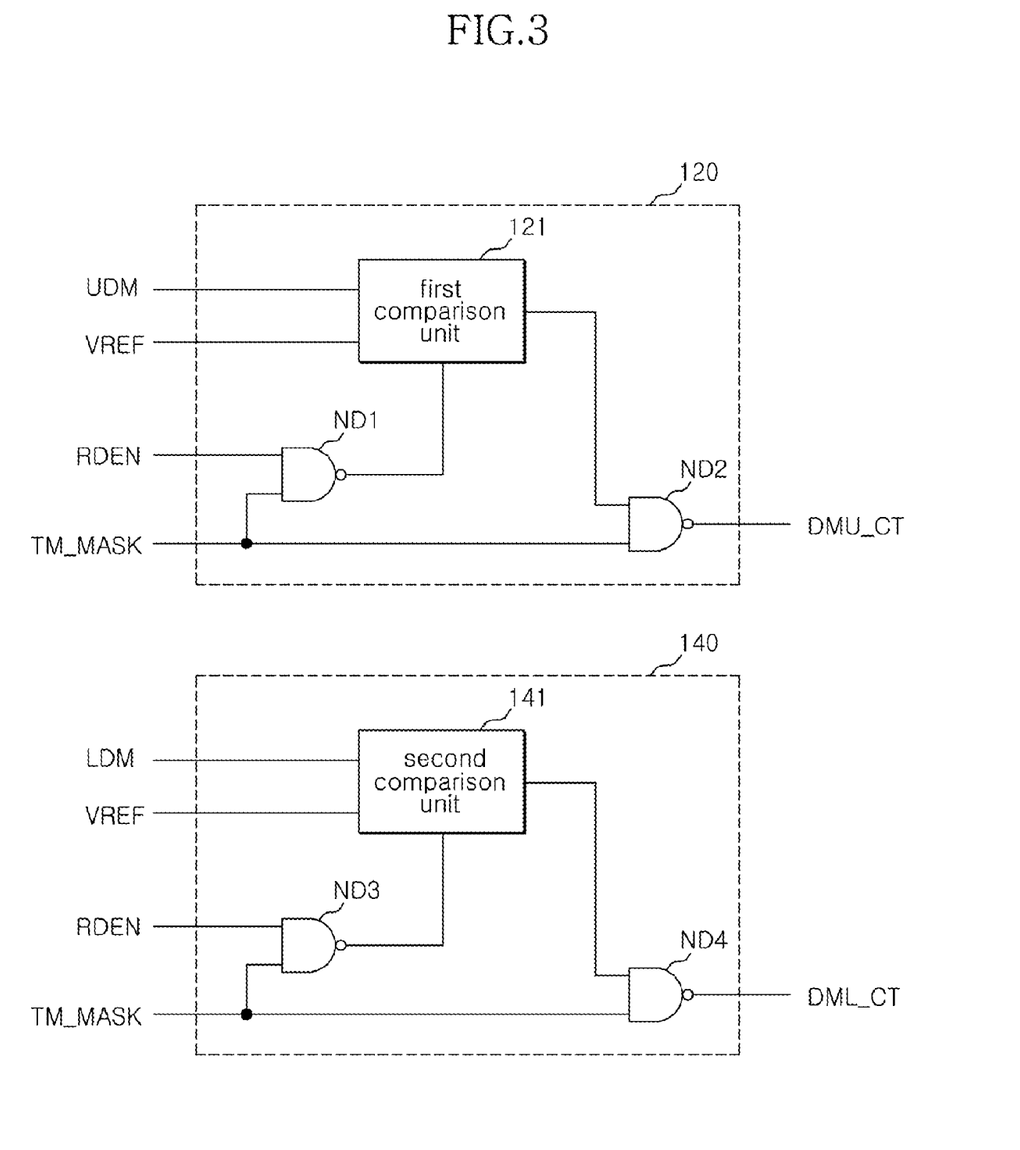
FIG. 3 is a circuit diagram illustrating the clock signal generating unit that can be included in the circuit illustrated in FIG. 2.

FIG. 2 is a block diagram illustrating a clock-control signal generating unit 100 as illustrated in FIG. 1. FIG. 3 is a circuit diagram illustrating the clock signal generating units 120 and 140 illustrated in FIG. 2. Referring to FIGS. 2 and 3, the clock-control signal generating unit 100 can include a first clock-control signal generating unit 120 and a second clock-control signal generating unit 140.

The first clock-control signal generating unit 120 can produce the first clock-control signal "DMU_CT" by receiving the upper data masking signal "UDM", the read command "RDEN", and the test mode signal "TM_MASK". When both the read command "RDEN" and the test mode signal "TM_MASK" are activated, the first clock-control signal generating unit 120 can produce the first clock-control signal "DMU_CT", which can be activated, in response to an activation of the upper data masking signal "UDM".

The second clock-control signal generating unit 140 can produce the second clock-control signal "DML_CT" by receiving the lower data masking signal "LDM", the read command "RDEN", and the test mode signal "TM_MASK". When both the read command "RDEN" and the test mode signal "TM_MASK" are activated, the second clock-control signal generating unit 140 can produce the second clock-control signal "DML_CT", which can be activated, in response to an activation of the lower data masking signal "LDM".

In more detail, the first clock-control signal generating unit 120 can include a first comparison unit 121, a first NAND gate ND1, and a second NAND gate ND2 (FIG. 3). The second clock-control signal generating unit 140 can include a second comparison unit 141, a third NAND gate ND3, and a fourth NAND gate ND4. Since the second clock-control signal generating unit 140 can be configured and can operate in the same as the first clock-control signal generating unit 120, only the first clock-control signal generating unit 120 will be described for convenience in illustration.

In the first clock-control signal generating unit 120, the first NAND gate ND1 can receive and combine the read command "RDEN" and the test mode signal "TM_MASK" and control the first comparison unit 121 based on the result of the combination. For example, if the first NAND gate ND1 outputs a signal in a low level, then the first comparison unit 121 can be activated and execute a comparison operation.

The first comparison unit 121, which can be employed as a circuit configured to decide the phase of the upper data masking signal "UDM", can be controlled by an output signal of the first NAND gate ND1. That is, when the first comparison unit 121 receives a low level signal from the first NAND gate ND1, the first comparison unit 121 can be activated for the comparison and output an output signal.

In more detail, the first comparison unit 121 can produce a low level signal when a voltage level of the upper data masking signal "UDM" is higher than that of the reference signal "VREF", and also produce a high level signal when the voltage level of the upper data masking signal "UDM" is lower than that of the reference signal "VREF", in response to the output signal of the first NAND gate ND1. The first comparison unit 121 can be a conventional comparator configured to compare the reference signal "VREF" with an input signal. Because a conventional comparator is well known, the detailed description thereof will be omitted. The second NAND gate ND2 can combine the output signal of the first comparison unit 121 and the test mode signal "TM_MASK" and then produce the first clock signal "DMU_CT".

The operation of the first clock signal generating unit 120 will be described. First, the case where the upper data masking signal "UDM" is provided as a first level signal of a high level will be described.

When the test mode is activated and the read operation is carried out, the first NAND gate ND1 can receive activated high level signals and then produce a low level signal. The first comparison unit 121 can produce a second level signal of a low level, by comparing the upper data masking signal "UDM" of the high level with the reference signal "VREF" in response to the output signal of the first NAND gate ND1. Therefore, the second NAND gate ND2 can receive the low level signal via an input terminal and can produce the first clock-control signal "DMU_CT", which can be activated in a high level, through a NAND operation.

In certain embodiments, the upper data masking signal "UDM" and the lower data masking signal "LDM", which can be applied from an external circuit, are 108° out of phase with each other. Accordingly, the second clock signal generating unit 140 can produce the second clock-control signal "DML_CT", which can be deactivated in a low level, by receiving the lower data masking signal "LDM".

In certain embodiments, the upper data masking signal "UDM" can be provided as a second level signal of a low level. In such embodiments, when the test mode is activated and the read operation is carried out, the first NAND gate ND1 can receive activated high level signals and then produce a low level signal. The first comparison unit 121 can produce a high level signal, by comparing the low level upper data masking signal "UDM" with the reference signal "VREF" in response to the output signal of the first NAND gate ND1. Therefore, the second NAND gate ND2 can receive the all the high level signal via both input terminals and can produce the first clock-control signal "DMU_CT", which is deactivated in a low level, through a NAND operation. At the same time, the second clock signal generating unit 140 can produce the second clock-control signal "DML_CT" which can be activated in a high level.

As mentioned above, when the test mode is activated and the read operation is carried out, the first clock-control signal "DMU_CT", which is activated, can be produced when the upper data masking signal "UDM" is in a high level. At the same time, the second clock-control signal "DML_CT", which is deactivated, can be provided by providing both the upper data masking signal "UDM" and the lower data masking signal "LDM" which is an inverted signal of the upper data masking signal "UDM".

Similarly, when test mode is activated and the read operation is carried out, the second clock-control signal "DML_CT", which is activated, can be provided when the lower data masking signal "LDM" is in a first level of a high level. At the same time, the first clock-control signal "DMU_CT", which is deactivated, can be provided.

Figure 4:
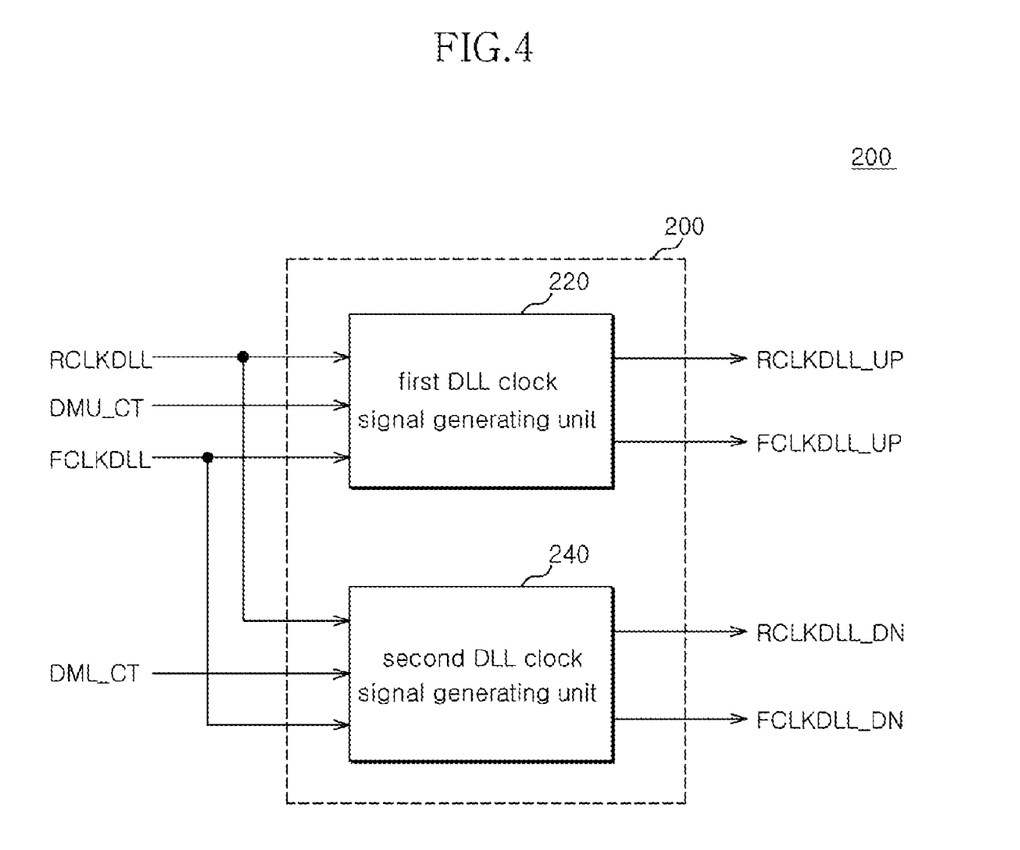
FIG. 4 is a block diagram illustrating a DLL clock signal generating unit that can be included in the circuit illustrated in FIG. 1.
Figure 5:
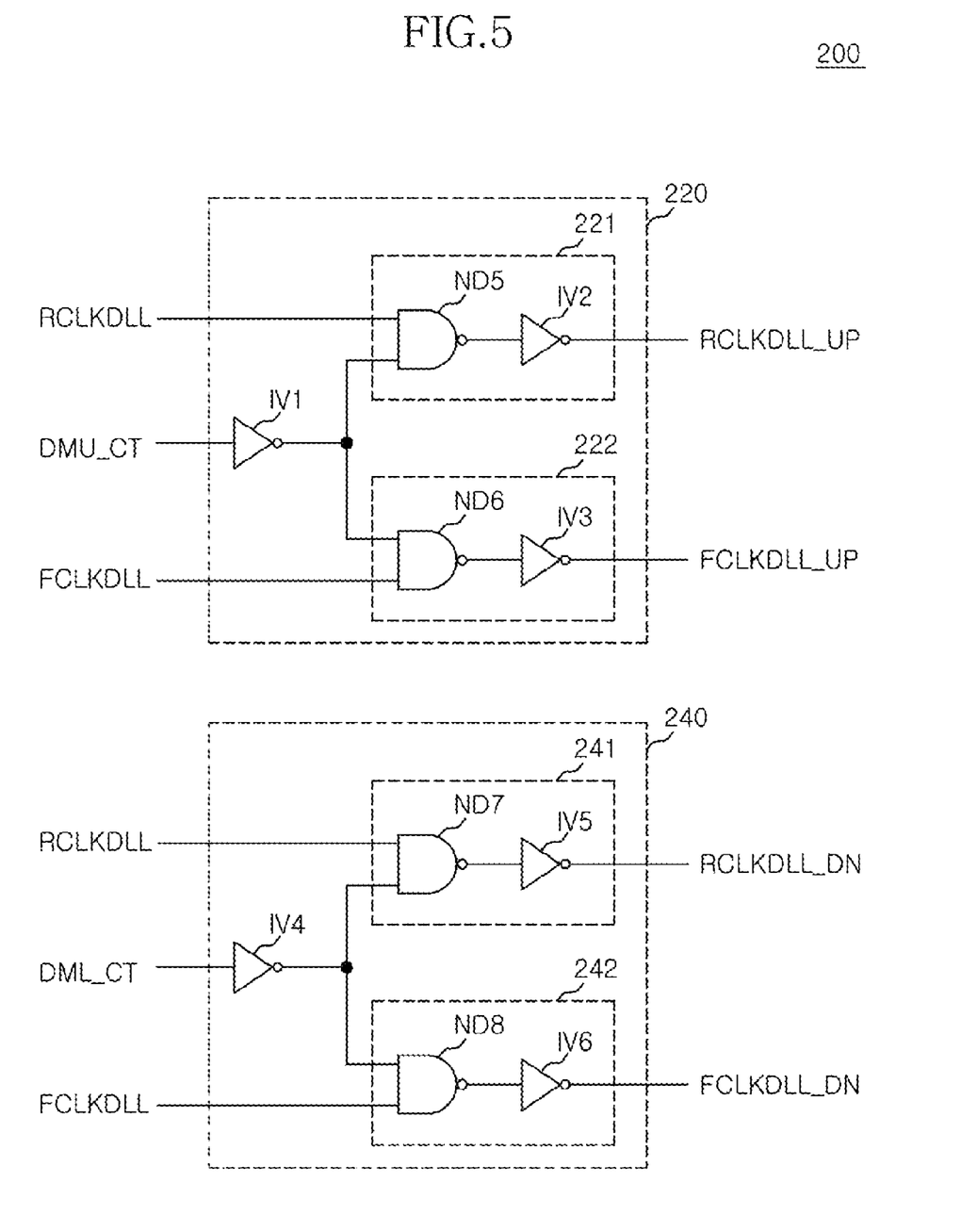
FIG. 5 is a circuit diagram illustrating the DLL clock signal generating unit that can be included in the circuit illustrated in FIG. 4.

FIGS. 4 and 5 are block and circuit diagrams illustrating a DLL clock signal generating unit 200 that can be included in the circuit illustrated in FIG. 1. Referring to FIGS. 4 and 5, a first DLL clock signal generating unit 220 can receive the DLL clock signals "RCLKDLL" and "FCLKDLL". Further, when the first DLL clock signal generating unit 220 receives the first clock-control signal "DMU_CT", which is activated, it can produce the upper data clock signals "RCLKDLL_UP" and "FCLKDLL_UP" in a fixed low level.

A second DLL clock signal generating unit 240 can receives the DLL clock signals "RCLKDLL" and "FCLKDLL". Further, when the second DLL clock signal generating unit 240 receives the second clock-control signal "DML_CT", which is activated, it can produce the lower data clock signals "RCLKDLL_DN" and "FCLKDLL_DN" in a fixed low level.

The first DLL clock signal generating unit 220 can include a first combination unit 221 and a second combination unit 222. The first combination unit 221 can include a fifth NAND gate ND5 and a second inverter IV2. The second combination unit 222 can include a sixth NAND gate ND6 and a third inverter IV3.

An inverted signal of the first clock signal "DMU_CT" can be received by the first and second combination units 221 and 222 via the inverter IV1. That is, the inverted signal of the first clock-control signal "DMU_CT" can be received by an input terminal of each of the fifth and sixth NAND gates ND5 and ND6. The fifth and sixth NAND gates ND5 and ND6 can produce NANDed signals and the NANDed signals can be outputted as the upper data clock signals "RCLKDLL_UP" and "FCLKDLL_UP" through the second and third inverters IV2 and IV3, respectively.

In case that the first clock-control signal "DMU_CT" is in a low level, the operation of the first DLL clock signal generating unit 220 will be described. When a high level signal is received by the input terminal of each of the fifth and sixth NAND gates ND5 and ND6, the DLL clock signals "RCLKDLL" and "FCLKDLL", which are respectively input into the fifth and sixth NAND gates ND5 and ND6 are inverted. Thereafter, the inverted DLL clock signals "RCLKDLL" and "FCLKDLL" can be inverted again through the second and third inverters IV2 and IV3, respectively. Therefore, the upper data clock signals "RCLKDLL_UP" and "FCLKDLL_UP", which are clocked as if the DLL clock signals "RCLKDLL" and "FCLKDLL" are clocked, are provided by the first and second combination units 221 and 222.

However, in case that the first clock-control signal "DMU_CT" is activated in a high level, a low level signal is received by the input terminal of each of the fifth and sixth NAND gates ND5 and ND6. Accordingly, the first DLL clock signal generating unit 220 can produce the upper data clock signals "RCLKDLL_UP" and "FCLKDLL_UP" in a fixed low level, regardless of the DLL clock signals "RCLKDLL" and "FCLKDLL".

In other words, the DLL clock signal generating unit 200 can produce the upper data clock signals "RCLKDLL_UP" and "FCLKDLL_UP" in a fixed low level in response to an activation of the first clock-control signal "DMU_CT" and also produce the upper data clock signals "RCLKDLL_UP" and "FCLKDLL_UP", which can be clocked, in response to a deactivation of the first clock-control signal "DMU_CT". Likewise, the DLL clock signal generating unit 200 can produce the lower data clock signals "RCLKDLL_DN" and "FCLKDLL_DN" in a fixed low level in response to an activation of the second clock-control signal "DML_CT" and also produce the lower data clock signals "RCLKDLL_DN" and "FCLKDLL_DN", which are clocked in response to a deactivation of the first clock-control signal "DML_CT".

Since the second DLL clock signal generating unit 240 can be the same the first DLL clock signal generating unit 220, the detailed description of the second DLL clock signal generating unit 240 will be omitted. However, the second DLL clock signal generating unit 240 of FIG. 6, according to another embodiment, can be different from that of FIG. 5 so that it will be described below.

Figure 6:
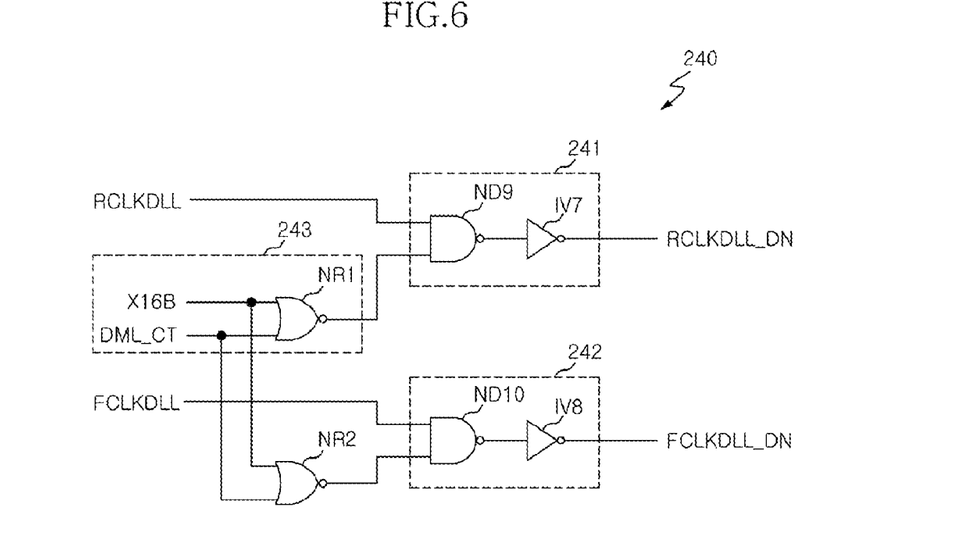
FIG. 6 is a circuit diagram illustrating a DLL clock signal generating unit that can be included in the circuit illustrated in FIG. 1, according to another embodiment described herein.

Referring to FIG. 6, similar to the second DLL clock signal generating unit 240 of FIG. 5, the second DLL clock signal generating unit 240, according to another embodiment, can also include the first and second combination units 241 and 242. The first combination unit 241 can include a ninth NAND gate ND9 and a seventh inverter IV7. The second combination unit 242 can include a tenth NAND gate ND10 and an eighth inverter IV8. The first and second combination units 241 and 242 can produce the lower data clock signals "RCLKDLL_DN" and "FCLKDLL_DN" in response to the second clock-control signal "DML_CT".

In contrast to the second DLL clock signal generating unit 240 of FIG. 5, the second DLL clock signal generating unit 240, according to another embodiment, can further include an option mode signal receiving unit 243. The option mode signal receiving unit 243 can include a first NOR gate NR1 configured to receive an I/O pin option mode signal X16B and the second clock-control signal "DML_CT". In the case that the semiconductor integrated circuit supports the X8 and X16 I/O modes, this additional circuit may be required when the lower data I/O pins are not used at the X8 I/O mode. That is, at an X16 I/O pin operation mode, an optional mode signal for X16 I/O mode must be activated in order to operate lower data I/O pins and circuits associated with this mode. Therefore, when the I/O pin option mode signal X16B is activated, the first NOR gate NR1 can act as the fourth inverter IV4 of FIG. 5. The second DLL clock signal generating unit 240 can also produce the lower data clock signals "RCLKDLL_DN" and "FCLKDLL_DN" in a fixed low level in response to a signal level of the second clock-control signal "DML_CT" or produces the clock signals of the lower data clock signals "RCLKDLL_DN" and "FCLKDLL_DN"

Figure 7:
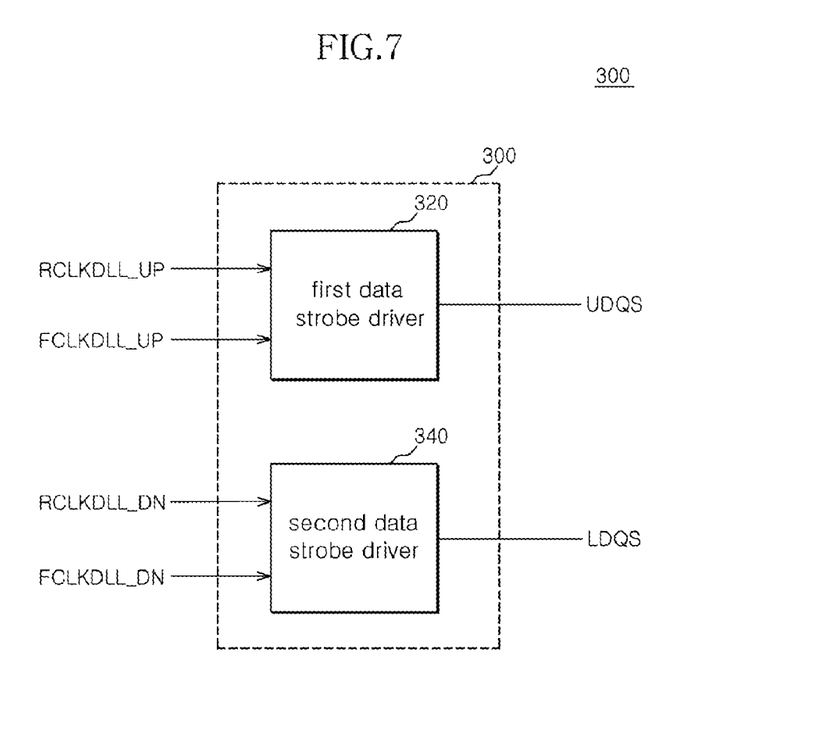
FIG. 7 is a block diagram illustrating a data strobe signal generating unit that can be included with reference to FIG. 1.

FIG. 7 is a block diagram illustrating the data strobe signal generating unit 300 that can be included with reference to FIG. 1. Referring to FIG. 7, the data strobe signal generating unit 300 can include a first data strobe driver 320 and a second data strobe driver 340.

The first data strobe driver 320 can receive the upper data clock signals "RCLKDLL_UP" and "FCLKDLL_UP" and then produce the upper data strobe signal "UDQS". When the first data strobe driver 320 receives the clock signals of the upper data clock signals "RCLKDLL_UP" and "FCLKDLL_UP", the upper data strobe signal "UDQS", which is toggled with a burst length (BL), can be produced. Meanwhile, when the first data strobe driver 320 receives the upper data clock signals "RCLKDLL_UP" and "FCLKDLL_UP" in a fixed low level, the upper data strobe signal "UDQS" can be produced in a high impedance (High-Z) level.

The second data strobe driver 340 can receive the lower data clock signals "RCLKDLL_DN" and "FCLKDLL_DN" and then produce the lower data strobe signal "LDQS". When the second data strobe driver 340 receives the clock signals of the lower data clock signals "RCLKDLL_DN" and "FCLKDLL_DN", the lower data strobe signal "LDQS", which is toggled with a burst length (BL), can be produced. Meanwhile, when the second data strobe driver 340 receives the lower data clock signals "RCLKDLL_DN" and "FCLKDLL_DN" in a fixed low level, the lower data strobe signal "LDQS" can be produced in a high impedance level.

On the other hand, when producing the upper and lower data strobe signals "UDQS" and "LDQS" which can be toggled with the burst length, they can have a pre-amble section for preparing the data output and a post-amble section for stabilizing the data output.

The data strobe signal generating unit 300 is a circuit that can receive general DLL clock signals "RCLKDLL" and "FCLKDLL" and then produce the data strobe signals "UDQS" and "LDQS". This data strobe signal generating unit is well known to those skilled in the art, and a detailed circuit of such a data strobe signal generating unit 300 is omitted for brevity.

Figure 8:
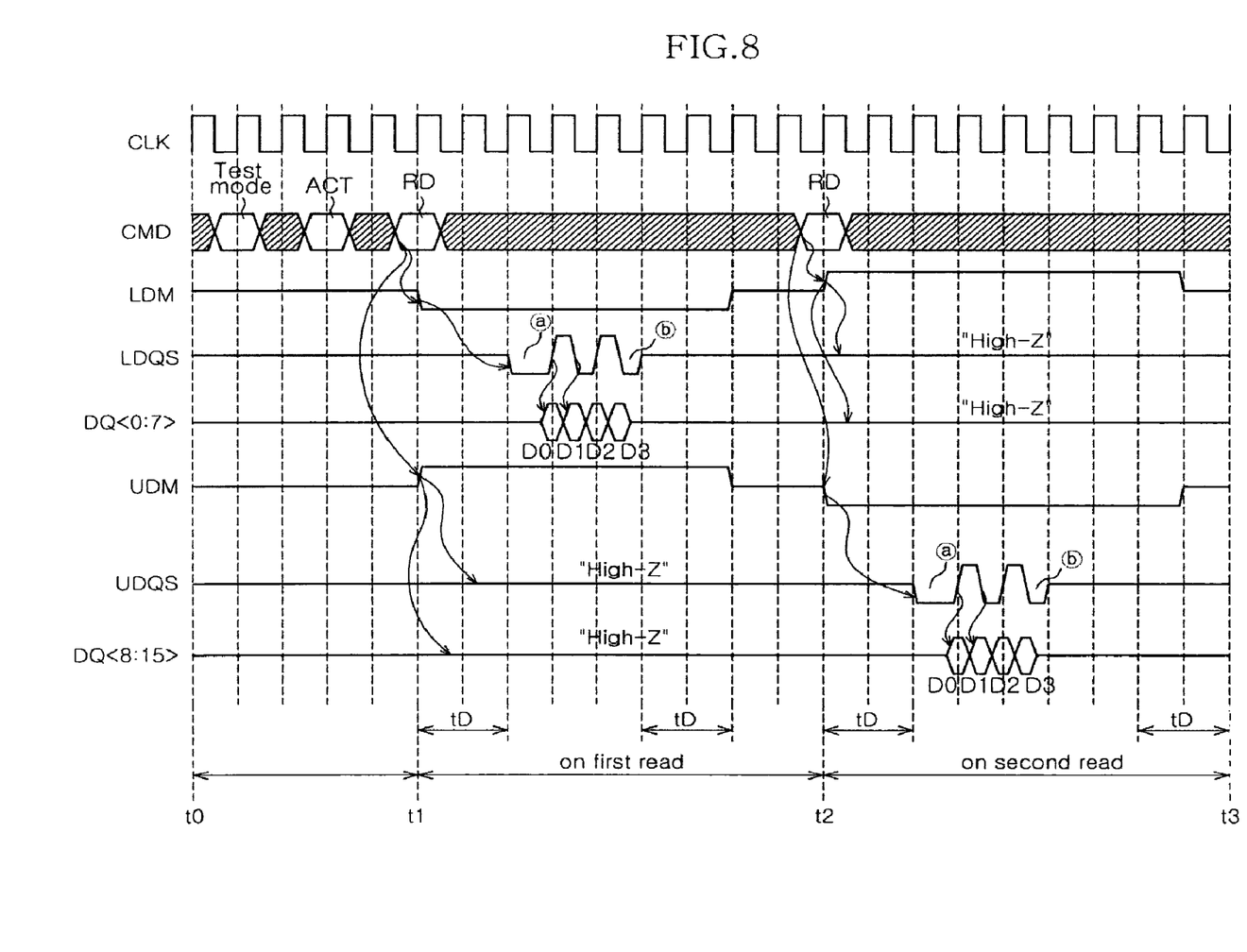
FIG. 8 is a timing diagram illustrating an operation of the test circuit that can be included with reference to FIG. 1.

FIG. 8 is a timing diagram illustrating an operation of the test circuit with reference to FIG. 1. Referring to FIG. 8, the test mode can be activated in a time section from t0 to t1. Thereafter, the upper data masking signal "UDM" can be applied in a high level in order to control the number of pins and data, which can be outputted at a first read operation in the time section from t0 to t1. The lower data masking signal "LDM" can be applied in a low level.

Accordingly, the upper data strobe signal "UDQS" can be maintained in a high impedance (High-Z) state in response to the upper data masking signal "UDM" of a high level. Since the upper data strobe signal "UDQS", which can be used as the reference signal in outputting the upper data, is in the high impedance level, the output data may be also in the high impedance level. However, since the lower data masking signal "LDM" can be deactivated in a low level, the lower data are not masked. Therefore, the lower data strobe signal "LDQS", which can be toggled with the burst length, can be produced.

Here, ⓐ designates the pre-amble section of the data strobe and ⓑ designates the post-amble section of the data strobe. Meanwhile, when the read command is received, the lower and upper masking signals "LDM" and "UDM" are applied from an external circuit. The lower data masking signal "LDM" can be received and the lower data strobe signal "LDQS" is activated after a predetermined time (tD). That is, if the read command is received, the lower and upper data masking signals "LDM" and "UDM" can be applied in order to control the number of data output pins. However, since the data strobe signals "LDQS" and "UDQS" must be actually produced at the time of outputting the data at the read operation, they are controlled in order that they are produced after activation of the lower and upper masking signals "LDM" and "UDM". The predetermined time (tD) can have, for example, two clock signal periods.

Thereafter, when the second read command is received in a time section from t2 to t3, the upper data are not masked in order to output the upper data. Accordingly, the upper data masking signal "UDM" can be applied in a low level for a deactivation and the low data masking signal "LDM" is applied in a high level for an activation. Likewise, the lower data strobe signal "LDQS" can be produced in a high impedance (High-Z) state in response to the lower data masking signal "LDM" which is activated. As a result, the lower data "DQ<0:7>" can be masked in a high impedance (High-Z) state. The upper data strobe signal "UDQS", as a toggle signal, is produced in response to an activation of upper data masking signal "UDM" after the predetermined time (tD).

The upper data "DQ<8:15>" can be output, being triggered by the upper data strobe signal "UDQS".

In the conventional semiconductor integrated circuits, the data can be masked at a write operation for the purpose of a specific execution. Even if this masking at the write operation is not illustrated in detail, it is also available in the semiconductor integrated circuits according to one embodiment. The test circuit according to one embodiment can use both the control signal and the clock signal to make it possible to mask the data at the read operation. With the activations of the test mode and the read command, the data masking determination signal can be activated. The data strobe signal of a corresponding group of bits can be outputted in a high impedance state and pass through each of the circuits in response to the data masking determination signal so that part of the data is masked for a predetermined time.

In other words, according to one embodiment, the data output pins can be controlled twice during the read operation in order to control the number of data pins. That is, data is outputted twice by alternatively masking the upper and lower data. By doing so, the state of total data I/O pins is checked and the efficiency is improved on the restricted resource of the number of the data pins. Furthermore, a cost-effective testing operation can be achieved, and the yield of the semiconductor integrated circuits is also increased by reducing the testing time.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A test circuit, comprising:
a data masking control unit configured to mask a part of output data in response to an activation of one of an upper data masking signal to control a group of upper data pins and a lower data masking signal to control a group of lower data pins when a test mode signal is activated at a read operation, wherein
the data masking control unit comprises:
a clock-control signal generating unit configured to receive a read command and generate a first clock-control signal and a second clock-control signal in response to the upper data masking signal and the lower data masking signal, respectively;
a DLL clock signal generating unit configured to generate an upper data clock signal and a lower data clock signal in response to the first clock-control signal and the second clock-control signal, respectively; and
a data strobe signal generating unit configured to generate an upper data strobe signal and a lower data strobe signal, which are used as reference signals for an upper data output and a lower data output, in response to the upper data clock signal and the lower data clock signal.

2. The test circuit of claim 1, wherein the clock signal generating unit comprises:
a first clock-control signal generating unit configured to generate the first clock-control signal in response to the upper data masking signal; and
a second clock-control signal generating unit configured to generate the second clock-control signal in response to the lower data masking signal.

3. The test circuit of claim 2, wherein each of the first and second clock-control signal generating units comprises:
a first combination gate configured to receive the read command and the test mode signal;
a first comparison unit configured to compare the upper data masking signal or the lower data masking signal with a voltage level of a comparison signal and output a comparison result in response to an output signal of the first combination gate; and
a second combination gate configured to combine the test mode signal and an output signal of the first comparison unit.

4. The test circuit of claim 3, wherein the first comparison unit is driven in response to the output signal of the first combination gate when both the read command and the test mode signal are activated.

5. The test circuit of claim 2, wherein the first clock-control signal generating unit is configured to generate the first clock-control signal which is activated when the read command and the upper data masking signal are activated and wherein the second clock-control signal generating unit generates the second clock-control signal which is activated when the read command and the lower data masking signal are activated.

6. The test circuit of claim 1, wherein the DLL clock signal generating unit comprises:
a first DLL clock signal generating unit configured to receive a DLL clock signal from an external circuit and then generate the upper data clock signal in a fixed low level when the first clock-control signal to be activated is received; and
a second DLL clock signal generating unit configured to receive the DLL clock signal and then generate the lower data clock signal in a fixed low level when the second clock-control signal to be activated received.

7. The test circuit of claim 6, wherein the DLL clock signal generating unit can generate the upper data clock signal and the lower data clock signal, which are clocked, in response to the first and second clock-control signals which are deactivated, respectively.

8. The test circuit of claim 6, wherein the second DLL clock signal generating unit is configured to activate by receiving an I/O pin option mode signal.

9. The test circuit of claim 1, wherein the strobe signal generating unit is configured to generate the upper and lower data strobe signals which are maintained in a high impedance state when the upper and lower data clock signals are received in a fixed low level.

10. A test circuit comprising:
a data masking control unit configured to maintain, in a high impedance state, one of upper and lower data strobe signals which are generated in response to an upper data masking signal to control a group of upper data pins and a lower data masking signal to control a group of lower data pins, when a test mode signal is activated at a read operation, wherein
the upper data masking signal is an inverted signal of the lower data masking signal, and
the data masking control unit comprises:
a clock-control signal generating unit configured to receive a read command and generate a first clock-control signal and a second clock-control signal in response to the upper data masking signal and the lower data masking signal, respectively;
a DLL clock signal generating unit configured to generate an upper data clock signal and a lower data clock signal in response to the first clock-control signal and the second clock-control signal, respectively; and a data strobe signal generating unit configured to generate an upper data strobe signal and a lower data strobe signal, which are used as reference signals for an upper data output and a lower data output, in response to the upper data clock signal and the lower data clock signal.

11. The test circuit of claim 10, wherein the clock-control signal generating unit includes:
a first clock-control signal generating unit configured to generate the first clock-control signal in response to the upper data masking signal; and
a second clock-control signal generating unit configured to generate the second clock-control signal in response to the lower data masking signal.

12. The test circuit of claim 11, wherein each of the first and second clock-control signal generating units includes:
a first combination gate configured to receive the read command and the test mode signal;
a first comparison unit configured to compare the upper data masking signal or the lower data masking signal with a voltage level of a comparison signal and outputting a comparison signal in response to an output signal of the first combination gate; and
a second combination gate configured to combine the test mode signal and an output signal of the first comparison unit.

13. The test circuit of claim 12, wherein the first comparison unit is driven in response to the output signal of the first combination gate when both the read command and the test mode signal are activated.

14. The test circuit of claim 11, wherein
the first clock control signal generating unit is configured to generate the first clock-control signal, which is activated when the read command and the upper data masking signal are activated, and
the second clock-control signal generating unit is configured to generate the second clock-control signal, which is activated when the read command and the lower data masking signal are activated.

15. The test circuit of claim 10, wherein the DLL clock signal generating unit includes:
a first DLL clock signal generating unit configured to receive a DLL clock signal from an external circuit and then generate the upper data clock signal in a fixed low level when the first clock-control signal to be activated is received; and
a second DLL clock signal generating unit configured to receive the DLL clock signal and then generate the lower data clock signal in a fixed low level when the second clock-control signal to be activated is received.

16. The test circuit of claim 15, wherein the DLL clock signal generating unit is configured to generate the upper data clock signal and the lower data clock signal, which are clocked, in response to the first and second clock-control signals, which are deactivated, respectively.

17. The test circuit of claim 15, wherein the second DLL clock signal generating unit is activated by receiving an I/O pin option mode signal.

18. The test circuit of claim 10 wherein the strobe signal generating unit is configured to generate the upper and lower data strobe signals, which are maintained in a high impedance state when the upper and lower data clock signals are received in a fixed low level.

19. A method for controlling a test circuit comprising:
applying an upper data masking signal to control a group of upper data pins and a lower data masking signal to control a group of lower data pins in response to a first read command while a test mode is activated and then masking data corresponding to the group of upper or lower data pins in response to a voltage level of the upper or lower data masking signal to be activated, wherein the upper data masking signal is an inverted signal of the lower data masking signal; and
applying a signal, which has an exclusive phase by inverting the upper or lower data masking signals, in response to a second read command while the test mode is activated and then masking data corresponding to the group of upper or lower data pins in response to a voltage level of the upper or lower data masking signal to be activated.

20. The method for claim 19, wherein an upper or lower data strobe signal is provided in a high impedance level in response to an activation signal of the upper or lower data masking signal.

21. The method for claim 19, wherein an upper or lower data strobe signal, which is clocked, is provided in response to an deactivation signal of the upper or lower data masking signal.

22. The method for claim 20, wherein the upper or lower data are outputted in the high impedance state when the upper or lower data strobe signal is in a high impedance level.

* * * * *